US010263416B2

(12) United States Patent
Deng

(10) Patent No.: US 10,263,416 B2
(45) Date of Patent: Apr. 16, 2019

(54) OVERVOLTAGE PROTECTION APPARATUS AND METHOD

(71) Applicant: Huawei Technologies Co., Ltd., Shenzhen (CN)

(72) Inventor: Zhiji Deng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 339 days.

(21) Appl. No.: 14/729,906

(22) Filed: Jun. 3, 2015

(65) Prior Publication Data

US 2015/0270707 A1 Sep. 24, 2015

Related U.S. Application Data

(63) Continuation of application No. PCT/CN2013/087404, filed on Nov. 19, 2013.

(30) Foreign Application Priority Data

Dec. 3, 2012 (CN) .......................... 2012 1 0508789

(51) Int. Cl.
*H02H 9/04* (2006.01)
*H02H 3/20* (2006.01)
(Continued)

(52) U.S. Cl.
CPC .............. *H02H 9/04* (2013.01); *H02H 3/202* (2013.01); *H02H 9/001* (2013.01); *H03K 17/0812* (2013.01); *H03K 2217/0045* (2013.01)

(58) Field of Classification Search
CPC .......... H02H 9/04; H02H 3/202; H02H 9/001; H03K 17/0812; H03K 2217/0045
See application file for complete search history.

(56) References Cited

U.S. PATENT DOCUMENTS 5,087,871 A * 2/1992 Losel .................... H02H 9/001 323/299
7,826,190 B2 * 11/2010 Wu ...................... H02H 3/202 361/111
(Continued)

FOREIGN PATENT DOCUMENTS

CN 2135845 Y 6/1993
CN 2250587 Y 3/1997
(Continued)

OTHER PUBLICATIONS

Partial English Translation and Abstract of Chinese Patent Application No. CN101119020A, May 27, 2015, 3 pages.
(Continued)

*Primary Examiner* — Zeev V Kitov
(74) *Attorney, Agent, or Firm* — Conley Rose, P.C.

(57) ABSTRACT

An overvoltage protection apparatus and method. The overvoltage protection apparatus includes: a determining unit, having an input end connected to an input end of the apparatus and an output end connected to an input end of a soft-start unit, and configured to determine whether an input voltage at the input end of the apparatus exceeds a preset protection voltage; and the soft-start unit, having an input end connected to the input end of the apparatus and an output end connected to an output end of the apparatus, where if the determining unit determines that the input voltage does not exceed the preset protection voltage and remains stable in a preset delay time, the soft-start unit delivers the input voltage to the output end of the apparatus; and otherwise, the soft-start unit does not deliver a voltage signal to the output end of the apparatus.

20 Claims, 6 Drawing Sheets

$P_{out}$
$P_{in}$
$C_1$
$Q_2$
A
$Q_1$
$R_2$
$R_1$
B
$D_1$
102
101

(51) Int. Cl.
*H02H 9/00* (2006.01)
*H03K 17/0812* (2006.01)

(56) References Cited

U.S. PATENT DOCUMENTS

| | | | | |
|---|---|---|---|---|
| 2001/0056323 | A1* | 12/2001 | Masters | B25J 9/16 701/115 |
| 2004/0184208 | A1 | 9/2004 | Liu | |
| 2005/0242779 | A1 | 11/2005 | Yoshio | |
| 2008/0158758 | A1 | 7/2008 | Salovaara et al. | |
| 2010/0277148 | A1 | 11/2010 | Zhao et al. | |
| 2010/0284116 | A1 | 11/2010 | Yoshizawa | |
| 2011/0181340 | A1* | 7/2011 | Gazit | H03K 19/018521 327/333 |
| 2012/0098587 | A1* | 4/2012 | Nakahara | H03K 17/08122 327/425 |

FOREIGN PATENT DOCUMENTS

| | | | |
|---|---|---|---|
| CN | 2275769 | Y | 3/1998 |
| CN | 2282290 | Y | 5/1998 |
| CN | 2297813 | Y | 11/1998 |
| CN | 2322299 | Y | 6/1999 |
| CN | 2567847 | Y | 8/2003 |
| CN | 2741087 | Y | 11/2005 |
| CN | 1750347 | A | 3/2006 |
| CN | 1819384 | A | 8/2006 |
| CN | 2814754 | Y | 9/2006 |
| CN | 2867678 | Y | 2/2007 |
| CN | 101119020 | A | 2/2008 |
| CN | 201185337 | Y | 1/2009 |
| CN | 101398694 | A | 4/2009 |
| CN | 201341015 | Y | 11/2009 |
| CN | 201478788 | U | 5/2010 |
| CN | 101739112 | A | 6/2010 |
| CN | 101752827 | A | 6/2010 |
| CN | 201601468 | U | 10/2010 |
| CN | 102035169 | A | 4/2011 |
| CN | 201877781 | U | 6/2011 |
| CN | 102340129 | A | 2/2012 |
| CN | 102594103 | A | 7/2012 |
| CN | 202353175 | U | 7/2012 |
| CN | 103036196 | A | 4/2013 |

OTHER PUBLICATIONS

Partial English Translation and Abstract of Chinese Patent Application No. CN103036196A, May 27, 2015, 2 pages.
Partial English Translation and Abstract of Chinese Patent Application No. CN102035169A, Aug. 12, 2015, 26 pages.
Partial English Translation and Abstract of Chinese Patent Application No. CN1750347A, Aug. 12, 2015, 22 pages.
Partial English Translation and Abstract of Chinese Patent Application No. CN1819384A, Aug. 12, 2015, 10 pages.
Partial English Translation and Abstract of Chinese Patent Application No. CN2135845A, Aug. 12, 2015, 7 pages.
Partial English Translation and Abstract of Chinese Patent Application No. CN2250587A, Aug. 12, 2015, 6 pages.
Partial English Translation and Abstract of Chinese Patent Application No. CN2275769A, Aug. 12, 2015, 10 pages.
Partial English Translation and Abstract of Chinese Patent Application No. CN2282290Y, Aug. 12, 2015, 11 pages.
Partial English Translation and Abstract of Chinese Patent Application No. CN2297813Y, Aug. 12, 2015, 6 pages.
Partial English Translation and Abstract of Chinese Patent Application No. CN2322299Y, Aug. 12, 2015, 8 pages.
Partial English Translation and Abstract of Chinese Patent Application No. CN2567847Y, Aug. 12, 2015, 6 pages.
Partial English Translation and Abstract of Chinese Patent Application No. CN2741087Y, Aug. 12, 2015, 12 pages.
Partial English Translation and Abstract of Chinese Patent Application No. CN2814754Y, Aug. 12, 2015, 9 pages.
Partial English Translation and Abstract of Chinese Patent Application No. CN2867678Y, Aug. 12, 2015, 10 pages.
Partial English Translation and Abstract of Chinese Patent Application No. CN101119020A, Aug. 12, 2015, 15 pages.
Partial English Translation and Abstract of Chinese Patent Application No. CN101752827A, Aug. 12, 2015, 10 pages.
Partial English Translation and Abstract of Chinese Patent Application No. CN102340129A, Aug. 12, 2015, 16 pages.
Partial English Translation and Abstract of Chinese Patent Application No. CN201185337Y, Aug. 12, 2015, 8 pages.
Partial English Translation and Abstract of Chinese Patent Application No. CN201341015Y, Aug. 12, 2015, 6 pages.
Partial English Translation and Abstract of Chinese Patent Application No. CN201478788U, Aug. 12, 2015, 16 pages.
Partial English Translation and Abstract of Chinese Patent Application No. CN201601468U, Aug. 12, 2015, 4 pages.
Partial English Translation and Abstract of Chinese Patent Application No. CN201877781U, Aug. 12, 2015, 6 pages.
Partial English Translation and Abstract of Chinese Patent Application No. CN202353175U, Aug. 12, 2015, 54 pages.
Foreign Communication From a Counterpart Application, Chinese Application No. 201210508789.2, Chinese Office Action dated Mar. 30, 2015, 5 pages.
Foreign Communication From a Counterpart Application, Chinese Application No. 201210508789.2, Chinese Office Action dated Aug. 26, 2014, 6 pages.
Foreign Communication From a Counterpart Application, PCT Application No. PCT/CN2013/087404, English Translation of International Search Report dated Feb. 20, 2014, 3 pages.
Foreign Communication From a Counterpart Application, PCT Application No. PCT/CN2013/087404, English Translation of Written Opinion dated Feb. 20, 2014, 8 pages.
Foreign Communication From a Counterpart Application, European Application No. 13860937.5, Extended European Search Report dated Oct. 29, 2015, 6 page.
Foreign Communication From a Counterpart Application, Japanese Application No. 2015-544334, Japanese Office Action dated May 13, 2016, 2 pages.
Foreign Communication From a Counterpart Application, Japanese Application No. 2015-544334, English Translation of Japanese Office Action dated May 17, 2016, 2 pages.

* cited by examiner

OVERVOLTAGE PROTECTION APPARATUS AND METHOD

CROSS-REFERENCE TO RELATED APPLICATIONS

This application is a continuation of International Application No. PCT/CN2013/087404, filed on Nov. 19, 2013, which claims priority to Chinese Patent Application No. 201210508789.2, filed on Dec. 3, 2012, both of which are hereby incorporated by reference in their entireties.

TECHNICAL FIELD

The present invention relates to an overvoltage protection apparatus, and in particular, to an overvoltage protection apparatus and method that prevent a high voltage power source from being mistakenly connected to a low voltage device.

BACKGROUND

An existing electronic product and device is generally powered by connecting an external power adapter between the product or device to be powered and a power source. However, without a uniform standard in the industry, various voltages are applied to devices provide by leading manufacturers, which results in a problem that when a customer mistakenly connects an adapter of a different manufacturer to a device, the device may be damaged because a voltage of the adapter does not match the device; in particular, when a high voltage adapter is mistakenly connected to a low voltage device, it may directly lead to overvoltage-caused burning of the low voltage device.

An existing solution for preventing a high voltage adapter from being mistakenly connected to a low voltage device is using a dedicated protection component, that is, using a dedicated chip for overvoltage protection, such as a fuse, on a device. However, the existing dedicated chip for overvoltage protection, such as the fuse, has a problem of supplying power by mistake, that is, when a high voltage adapter is connected and during a process in which an input voltage rises, a device is transiently powered, and the power source is disconnected only when the input voltage reaches a set protection value; therefore, the device is in a state of being transiently powered when the power source is connected, which affects user experience.

SUMMARY

Problem to be Resolved by the Present Invention

An objective of the present invention is to provide an overvoltage protection apparatus and method, which can ensure that a device is powered only when a correct and stable power source is connected.

Solutions Used for Resolving the Problem

To achieve the foregoing objective, a first aspect of the present invention provides an overvoltage protection apparatus, which includes a determining unit, having an input end connected to an input end of the apparatus and an output end connected to an input end of a soft-start unit, and configured to determine whether an input voltage at the input end of the apparatus exceeds a preset protection voltage, and send a result of the determining to the soft-start unit; and the soft-start unit, where an input end of the soft-start unit is separately connected to the output end of the determining unit and the input end of the apparatus, and an output end soft-start unit is connected to an output end of the apparatus, and if the determining unit determines that the input voltage does not exceed the preset protection voltage and remains stable in a preset delay time, the soft-start unit delivers the input voltage to the output end of the apparatus; otherwise, the soft-start unit does not deliver a voltage signal to the output end of the apparatus.

With reference to the first aspect, in a first possible implementation manner, the determining unit includes: a first transistor having a source connected to the input end of the apparatus and a drain connected to the input end of the soft-start unit; a Zener diode having a positive electrode connected to a gate of the first transistor and a negative electrode connected to a ground terminal; and a second resistor, connected between the source and the gate of the first transistor; and the soft-start unit includes a second transistor having a source connected to the input end of the apparatus, a gate connected to the drain of the first transistor, and a drain connected to the output end of the apparatus; a first resistor, connected between the gate of the second transistor and the ground terminal; and a capacitor, connected between the source and the gate of the second transistor.

With reference to the first possible implementation manner of the first aspect, in a second possible implementation manner, the first transistor is disconnected when the input voltage does not exceed the preset protection voltage, and the second transistor is conducted when the input voltage does not exceed the preset protection voltage and after the input voltage remains stable in a preset delay time.

With reference to the first possible implementation manner of the first aspect, in a third possible implementation manner, the first transistor is conducted when the input voltage exceeds the preset protection voltage, and the second transistor is disconnected when the input voltage exceeds the preset protection voltage.

With reference to the first possible implementation manner, the second possible implementation manner, or the third possible implementation manner of the first aspect, in a fourth possible implementation manner, the preset protection voltage depends on a sum of a Zener voltage of the Zener diode and a threshold voltage of the first transistor.

With reference to the first possible implementation manner, the second possible implementation manner, the third possible implementation manner, or the fourth possible implementation manner of the first aspect, in a fifth possible implementation manner, the first transistor and the second transistor are p-channel metal-oxide-semiconductor (PMOS) transistors.

A second aspect of the present invention provides an overvoltage protection method, which includes determining whether an input voltage exceeds a preset protection voltage; and if the input voltage does not exceed the preset protection voltage and remains stable in a preset delay time, delivering the input voltage; otherwise, skipping delivering a voltage signal.

Effects of the Present Invention

According to the apparatus and method provided by the present invention, a device is powered only when an input voltage does not exceed an allowable voltage range of the device and the input voltage is stable, which can efficiently avoid damage caused by a high voltage power source to a low voltage device, and can effectively avoid supplying power by mistake during a process in which the voltage rises, thereby avoiding a phenomenon of transient connection and disconnection.

In addition, the present invention is simple in design, low in cost, highly practical, and highly portable.

According to the following detailed description of the exemplary embodiments with reference to the accompanying drawings, other features and aspects of the present invention will become clear.

BRIEF DESCRIPTION OF DRAWINGS

Accompanying drawings, included in this specification and form a part of this specification, illustrate exemplary embodiments, features and aspects of the present invention together with this specification, and are used to explain the principle of the present invention.

DESCRIPTION OF EMBODIMENTS

The following will describe various exemplary embodiments, features and aspects of the present invention in detail with reference to the accompanying drawings. Like signs in the accompanying drawings represent elements with like or similar functions. Although various aspects of the embodiments are illustrated in the accompanying drawing, the accompanying drawings are not necessarily drawn in proportion unless otherwise specified.

Herein, the dedicated word "exemplary" means serving as an example, embodiment or illustrative. Any embodiment described as being "exemplary" herein is not necessarily explained as being superior to or better than other embodiments.

In addition, for better description of the present invention, various specific details are given in the following specific implementation manner. A person skilled in the art should understand that the present invention may also be implemented without these specific details. In some other embodiments, well-known methods, means, elements and circuits are not described in detail, so as to highlight the main idea of the present invention.

Figure 1:
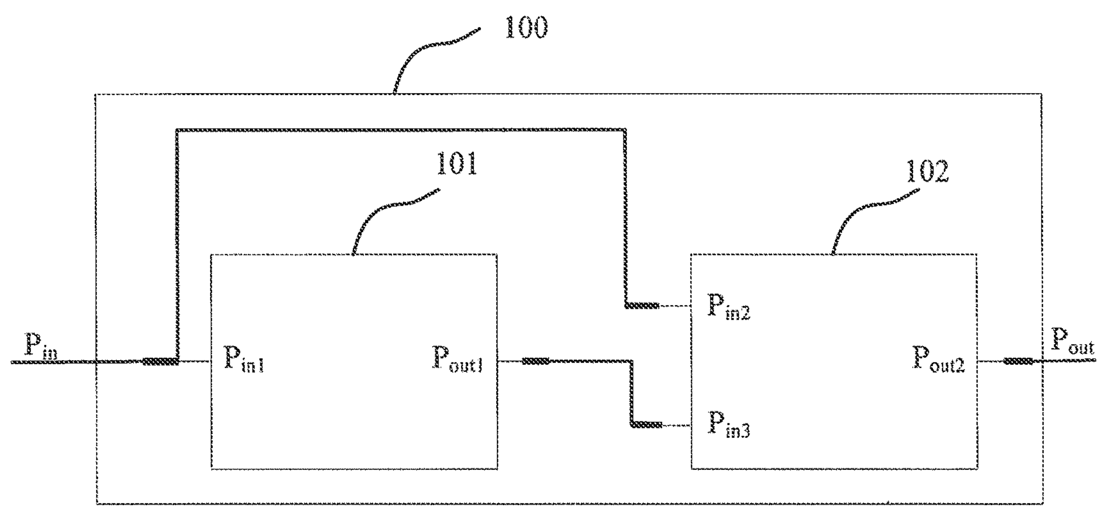
FIG. 1 illustrates a structural diagram of an overvoltage protection apparatus according to an embodiment of the present invention.

FIG. 1 illustrates a structural diagram of an overvoltage protection apparatus 100 according to an embodiment of the present invention. In this embodiment, the overvoltage protection apparatus includes a determining unit 101 and a soft-start unit 102.

The determining unit 101 has a first input end $P_{in1}$ and a first output end $P_{out1}$, where the first input end $P_{in1}$ connects to an input end $P_{in}$ of the overvoltage protection apparatus. In a case in which an input voltage $V_{in}$ at the input end $P_{in}$ is greater than a protection voltage $V_p$ of the overvoltage protection apparatus 100, the first input end $P_{in1}$ is connected to the first output end $P_{out1}$. In a case in which the input voltage $V_{in}$ at the input end $P_{in}$ is not greater than the protection voltage $V_p$, the first input end $P_{in1}$ is disconnected from the first output end $P_{out1}$.

The soft-start unit 102 has a second input end $P_{in2}$, a third input end $P_{in3}$ and a second output end $P_{out2}$, where the second input end $P_{in2}$ is electrically connected to the input end $P_{in}$ of the overvoltage protection apparatus, the third input end $P_{in3}$ is electrically connected to the first output end $P_{ou1}$, and the second output end $P_{out2}$ is electrically connected to an output end $P_{out}$ of the overvoltage protection apparatus 100. In a case in which the input voltage $V_{in}$ at the input end $P_{in}$ is greater than the protection voltage $V_p$, that is, the first input end $P_{in1}$ is connected to the first output end $P_{out1}$, the second input end $P_{in2}$ is disconnected from the second output end $P_{out2}$, that is, no voltage signal is delivered to the output end $P_{out}$ of the overvoltage protection apparatus 100. In a case in which the input voltage $V_{in}$ at the input end $P_{in}$ is not greater than the protection voltage $V_p$, that is, the first input end $P_{in1}$ is disconnected from the first output end $P_{out1}$, the second input end $P_{in2}$ is connected to the second output end $P_{out2}$ after the input voltage $V_{in}$ stabilizes for a preset delay time, so as to deliver the input voltage $V_{in}$ to the output end $P_{out}$ of the overvoltage protection apparatus 100.

The input end $P_{in}$ of the overvoltage protection apparatus is configured to connect to an external adapter, and the output end $P_{out}$ is configured to connect to a device to be powered. Preferably, the protection voltage $V_p$ of the overvoltage protection apparatus is a highest power source voltage that can be borne by the device connected to the overvoltage protection apparatus.

The determining unit 101 is configured to determine whether the input voltage $V_{in}$ exceeds the protection voltage $V_p$. The soft-start unit 102, on one hand, delivers the input voltage at the output end (that is, to the device) only when the input voltage $V_{in}$ does not exceed the protection voltage and an overvoltage exceeding the protection voltage does not exist in a delay time, so as to avoid supplying power by mistake during a process in which a supply voltage of an adapter rises; on the other hand, after the input voltage exceeds the protection voltage, the unit performs overvoltage protection by immediately stopping delivering a voltage signal to the output end, and ensures that the unit is conducted for power supply again only when the power source voltage is always lower than the protection voltage within a period of time. The delayed recovery helps to avoid repeated turning on and off caused by critical high voltage fluctuation.

Figure 2:
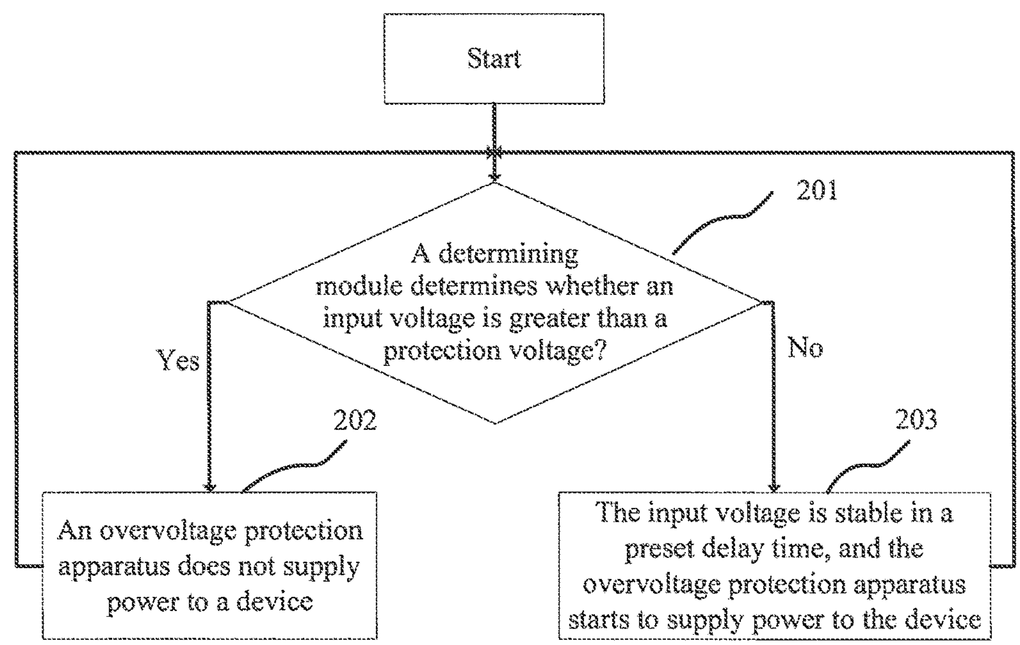
FIG. 2 illustrates a flowchart of a working process of an overvoltage protection apparatus according to an embodiment of the present invention.

FIG. 2 illustrates a flowchart of a working process of an overvoltage protection apparatus according to an embodiment of the present invention.

In step S201, a determining unit determines whether an input voltage $V_{in}$ is greater than a protection voltage $V_p$; if yes, the working process proceeds with step S202; if not, the working process proceeds with step S203.

In step S202, the overvoltage protection apparatus does not supply power to a device to be powered, and the working process returns to step S201;

In step S203, if the input voltage $V_{in}$ is stable in a preset delay time, the overvoltage protection apparatus starts to supply power to the device, and the working process returns to step S201.

Figure 3:
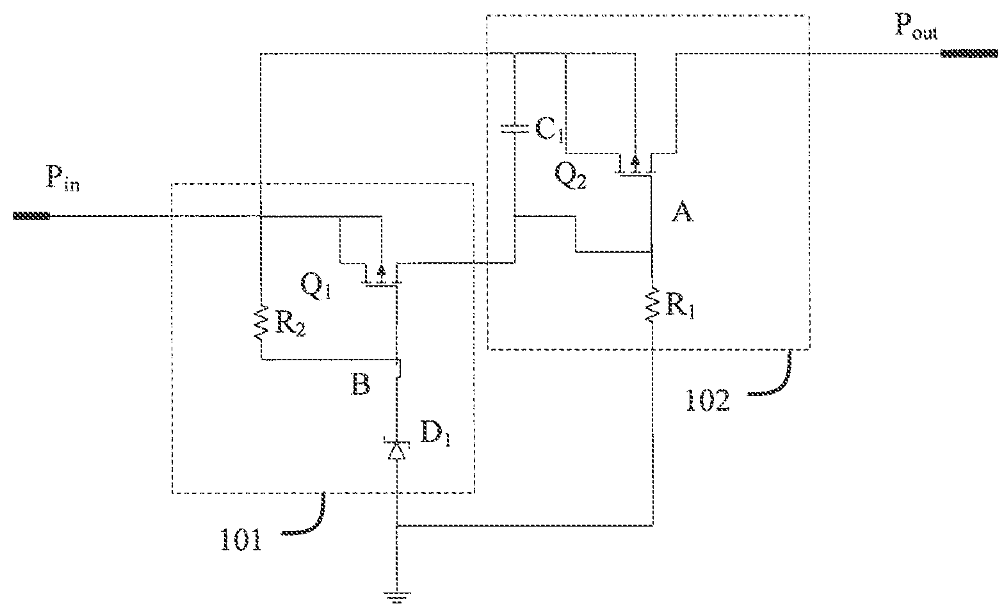
FIG. 3 illustrates a structural diagram of an overvoltage protection apparatus according to another embodiment of the present invention.

FIG. 3 is a structural diagram of an overvoltage protection apparatus according to another embodiment of the present invention. In this embodiment, the overvoltage protection apparatus includes: a first transistor $Q_1$ having a source connected to an input end $P_{in}$ of the overvoltage protection apparatus; a second transistor $Q_2$ having a source connected to the input end $P_{in}$ of the overvoltage protection apparatus, a gate connected to a drain of the first transistor $Q_1$, and a drain connected to an output end $P_{out}$ of the overvoltage protection apparatus; a Zener diode $D_1$ having a positive electrode connected to a gate of the first transistor $Q_1$ and a negative electrode connected to a ground terminal; a first resistor $R_1$, connected between the gate of the second transistor $Q_2$ and the ground terminal; a second resistor $R_2$, connected between the source and the gate of the first transistor $Q_1$; and a capacitor $C_1$, connected between the source and the gate of the second transistor $Q_2$.

The second resistor $R_2$, the Zener diode $D_1$ and the first transistor $Q_1$ form the foregoing determining unit 101, and the capacitor $C_1$, the first resistor $R_1$ and the second transistor $Q_2$ form the foregoing soft-start unit 102.

Although in FIG. 3, symbols of PMOS field effect transistors are used to represent the first transistor and the second transistor ($Q_1$, $Q_2$), and for simplicity of description, the following uses the PMOS transistor as an example to describe various exemplary embodiments and various working modes of the overvoltage protection apparatus in the embodiment, and it should be understood that the first transistor and the second transistor are not limited to the PMOS transistors, and another type of transistor, such as a bipolar transistor, may be used.

The following will introduce different working modes of the overvoltage protection apparatus of the embodiment; and for ease of understanding, the basic working principles of the PMOS transistor and the Zener diode are first introduced.

Figure 4A:
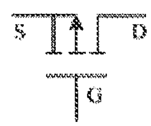
FIG. 4A and FIG. 4B illustrate schematic diagrams of a PMOS transistor and a Zener diode.
Figure 4B:
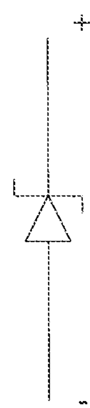

FIG. 4A and FIG. 4B illustrate schematic diagrams of the PMOS transistor and the Zener diode respectively. For the PMOS transistor in FIG. 4A, when a voltage difference between a source S and a gate G is greater than an inherent turn-on voltage (a threshold voltage) $V_{th}$ of the PMOS transistor, a drain D and the source S are conducted; and otherwise, the drain D and the source S are disconnected. For the Zener diode in FIG. 4B, when a voltage difference between a positive electrode and a negative electrode exceeds a Zener voltage $V_{ref}$ of the Zener diode and if a current passing the Zener diode is less than a maximum through current $I_{max}$, the voltage difference between the positive electrode and the negative electrode is forcedly fixed at $V_{ref}$.

Normal Power Supply Mode

Figure 5A:
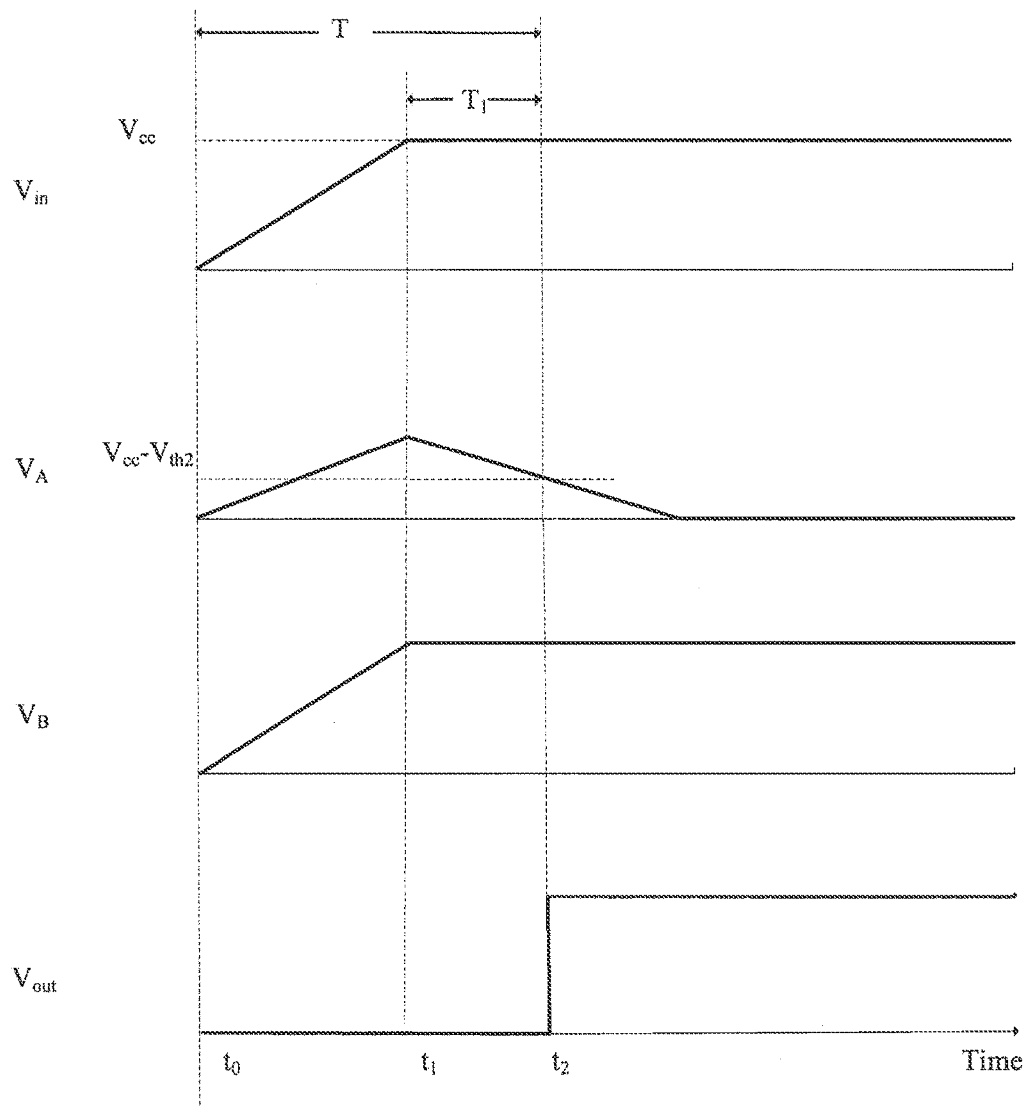
FIG. 5A and FIG. 5B illustrate operational timing diagrams of the overvoltage protection apparatus according to the embodiment described in FIG. 3 in a normal power supply mode.
Figure 5B:
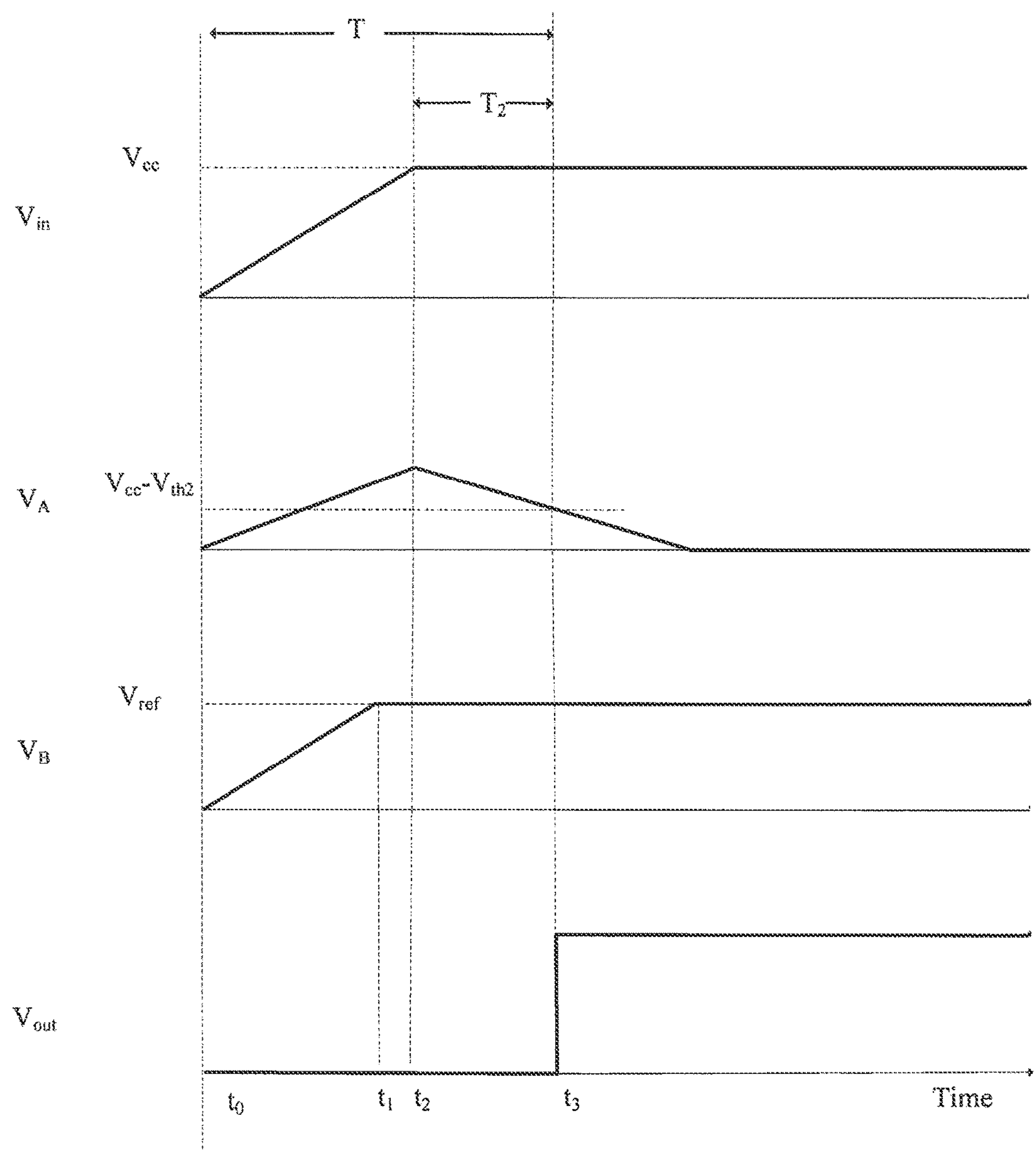

FIG. 5A and FIG. 5B separately illustrate waveform diagrams of the overvoltage protection apparatus described in FIG. 3 in a normal power supply mode. The normal power supply mode refers to that an input voltage $V_{in}$ (for example, a voltage provided by an external adapter) of the overvoltage protection apparatus gradually rises from a low voltage and stabilizes at a voltage $V_{cc}$, where the voltage $V_{cc}$ does not exceed a maximum allowable voltage that a device can bear, that is, a preset protection voltage $V_P$ of the overvoltage protection apparatus.

FIG. 5A illustrates a waveform diagram in a normal power supply mode in a case of $V_{cc}<V_{ref}$. At time $t_0$ shown in FIG. 5A, an adapter is connected to the overvoltage protection apparatus described in the embodiment, where the overvoltage protection apparatus is connected to a device to be powered. After that, in a time period from the time $t_0$ to time $t_1$, the voltage $V_{in}$ at an input end of the overvoltage protection apparatus gradually rises from 0 to the $V_{cc}$.

In a process in which the $V_{in}$ is rising (in the time period from the $t_0$ to the $t_1$), both the Zener diode $D_1$ and the first transistor Q1 are in a disconnected state because $V_{cc}<V_{ref}$, a voltage $V_B$ at a point B in an electric circuit rises to the $V_{cc}$ synchronously with the voltage $V_{in}$ at the input end. At the same time, because of the presence of the capacitor $C_1$, a voltage $V_A$ at a point A in the electric circuit also starts to rise from 0 together with the voltage $V_{in}$ at the input end. However, due to discharging from the first resistor $R_1$ to the capacitor $C_1$ in the process, a rising speed of the voltage $V_A$ at the point A is slightly slower than a rising speed of the voltage $V_{in}$ at the input end.

From the time $t_1$, the voltage $V_{in}$ at the input end reaches the $V_{cc}$ and remains stable, and at this time, the first resistor $R_1$ continuously discharges to the capacitor $C_1$, to make the voltage $V_A$ at the point A start to drop. However, between the time $t_1$ and time $t_2$, the voltage at the point A meets $V_A>V_{cc}-V_{th2}$ (the $V_{th2}$ is a threshold voltage of the second transistor $Q_2$), and therefore, a gate-source voltage of the second transistor $Q_2$ does not reach the threshold voltage $V_{th2}$, and the second transistor $Q_2$ still remains in a disconnected state.

At the time $t_2$, the voltage $V_A$ at the point A drops to $V_{cc}-V_{th2}$, the gate-source voltage of the second transistor $Q_2$ reaches the $V_{th2}$, the second transistor $Q_2$ is conducted, the voltage $V_{in}$ at the input end of the overvoltage protection apparatus is delivered to the output end, and the overvoltage protection apparatus starts to normally supply power to the device to be powered. After the time $t_2$, the first resistor $R_1$ continuously discharges to the capacitor $C_1$ until the voltage $V_A$ at the point A drops to 0.

It may be seen from the foregoing analysis that, in the case of $V_{cc}<V_{ref}$, the overvoltage protection apparatus is in the normal power supply mode, and if the adapter is connected to the overvoltage protection apparatus at the time $t_0$, the voltage $V_{out}$ at the output end remains to be 0 in the time period from the time $t_0$ to time $t_2$ and is delivered after the time $t_2$, which is delayed for a time $T_1$ compared with the time $t_1$ at which the input voltage $V_{in}$ reaches the $V_{cc}$ and starts to remain stable, and is delayed for a time T compared with the time $t_0$ at which the adapter is connected. A charging and discharging circuit formed by the capacitor $C_1$ and the first resistor $R_1$ controls a rate of change of the voltage at the point A, that is, determines the delay time $T_1$ and the delay time T.

FIG. 5B illustrates a waveform diagram in a normal power supply mode in a case of $V_{ref}\leq V_{cc}\leq V_{ref}+V_{th1}$, where $V_{th1}$ is a threshold voltage of the first transistor $Q_1$. At time $t_0$ shown in FIG. 5B, an adapter is connected to the overvoltage protection apparatus described in the embodiment. After that, in the time period from the time $t_0$ to time $t_1$, the voltage $V_{in}$ at the input end of the overvoltage protection apparatus gradually rises from 0 to the $V_{cc}$.

Because $V_{ref}\leq V_{cc}\leq V_{ref}+V_{th1}$, during a process in which the $V_{in}$ is rising, in a case of $V_{in}$<Vref (the time period from the $t_0$ to the $t_1$), both the Zener diode $D_1$ and the first transistor Q1 are in a disconnected state, a voltage $V_B$ at a point B in an electric circuit rises synchronously with the voltage $V_{in}$ at the input end. At the same time, because of the presence of the capacitor $C_1$, a voltage $V_A$ at a point A in the electric circuit also starts to rise from 0 together with the voltage $V_{in}$ at the input end. However, due to discharging from the first resistor $R_1$ to the capacitor $C_1$ in the process, a rising speed of the voltage $V_A$ at the point A is slightly slower than a rising speed of the voltage $V_{in}$ at the input end.

At the time $t_1$, the voltage $V_{in}$ at the input end reaches the $V_{ref}$, the Zener diode $D_1$ starts to remain the Zener voltage $V_{ref}$ from the time $t_1$. However, because $V_{in}<V_{cc}\leq V_{ref}+V_{th1}$, the first transistor $Q_1$ still remains in a disconnected state, and the voltage $V_A$ at the point A continuously rises at a rate slower than that of the $V_{in}$.

At time $t_2$, the voltage $V_{in}$ at the input end reaches the $V_{cc}$ and remains stable, the first resistor $R_1$ continuously discharges to the capacitor $C_1$, to make the voltage $V_A$ at the point A start to drop. However, between the time $t_2$ and time $t_3$, the voltage at the point A meets $V_A>V_{cc}-V_{th2}$, and therefore, a gate-source voltage of the second transistor $Q_2$ does not reach the threshold voltage $V_{th2}$, and the second transistor $Q_2$ still remains in a disconnected state.

At the time $t_3$, the voltage $V_A$ at the point A drops below $V_{cc}-V_{th2}$, the gate-source voltage of the second transistor $Q_2$ reaches the $V_{th2}$, the second transistor $Q_2$ is conducted, the voltage $V_{in}$ at the input end of the overvoltage protection apparatus is delivered to the output end, and the overvoltage protection apparatus starts to normally supply power to the device. After the time $t_3$, the first resistor $R_1$ continuously discharges to the capacitor $C_1$ until the voltage $V_A$ at the point A drops to 0.

It may be seen from the foregoing analysis that, in the case of $V_{ref}\leq V_{cc}\leq V_{ref}+V_{th1}$, similar to that of the case of $V_{cc}<V_{ref}$, the overvoltage protection apparatus is also in the normal power supply mode. If the adapter is connected to the overvoltage protection apparatus at the time $t_0$, the voltage $V_{out}$ at the output end remains to be 0 in the time period from the time $t_0$ to the time $t_3$, and is delivered after the time $t_3$. The time $t_3$ is delayed for a time $T_2$ compared with the time $t_2$ at which the voltage at the input end stabilizes, and is delayed for a time T compared with the time $t_0$ at which the adapter is connected. A charging and discharging circuit formed by the capacitor $C_1$ and the first resistor $R_1$ controls a rate of change of the voltage at the point A, that is, determines the delay time $T_2$ and the delay time T.

It may be seen from the foregoing analysis that, the overvoltage protection apparatus in the embodiment should meet the condition of $V_{cc}\leq V_{ref}+V_{th1}$ when working in the normal power supply mode. That is, on the premise that a sum of the Zener voltage $V_{ref}$ of the Zener diode $D_1$ and the threshold voltage $V_{th1}$ of the first transistor $Q_1$ does not exceed an allowable voltage of the device to be powered, the Zener diode $D_1$ and the first transistor $Q_1$ are properly selected, so that the first transistor is disconnected when the input voltage is lower than the protection voltage $V_{ref}-V_{th1}$, and the second transistor is conducted after the input voltage reaches a stable state and remains in the stable state for a first delay time. A preset protection voltage $V_p$ of the overvoltage protection apparatus in the embodiment depends on the Zener voltage $V_{ref}$ of the Zener diode $D_1$ and the threshold voltage $V_{th1}$ of the first transistor $Q_1$.

High Voltage Protection Mode

Figure 6:
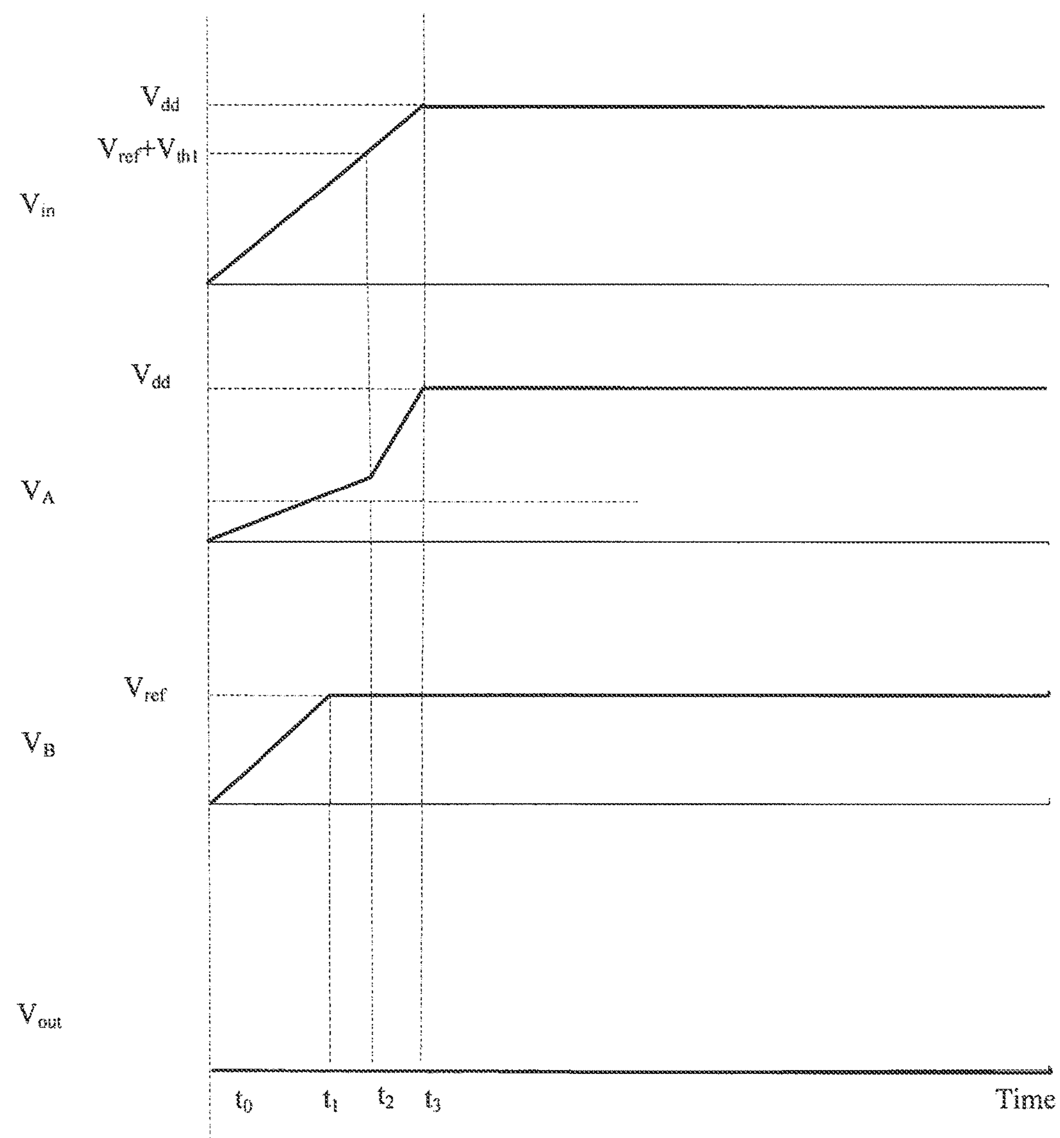
FIG. 6 illustrates an operational timing diagram of the overvoltage protection apparatus according to the embodiment described in FIG. 3 in a high voltage protection mode.

FIG. 6 illustrates a waveform diagram of the overvoltage protection apparatus according to the embodiment described in FIG. 3, where the overvoltage protection apparatus works in a high voltage protection mode. The high voltage protection mode refers to that an input voltage $V_{in}$ (for example, a voltage provided by an external adapter) of the overvoltage protection apparatus gradually rises from a low voltage, and stabilizes at a voltage $V_{dd}$ that is higher than the protection voltage $V_p$ of the overvoltage protection apparatus, that is, $V_{dd}>V_{ref}+V_{th1}$.

Compared with the normal mode shown in FIG. 5B, the high voltage protection mode is different in that, at the time $t_1$, when the input voltage $V_{in}$ rises to the Zener voltage $V_{ref}$ of the Zener diode $D_1$, the Zener diode $D_1$ enters into a regulated state, and the voltage $V_B$ at the point B stabilizes at the $V_{ref}$ and does not change with the $V_{in}$ any longer. Subsequently, when the $V_{in}$ continuously rises and reaches the protection voltage $V_{ref}+V_{th1}$ at the time $t_2$, the first transistor $Q_1$ is conducted because the gate-source voltage of the first transistor $Q_1$ reaches the $V_{th1}$, and the input voltage $V_{in}$ is delivered to the point A, so that the voltage at the point A synchronously continues to rise with the input voltage $V_{in}$ until the time $t_3$ at which the input voltage $V_{in}$ reaches and stabilizes at the $V_{dd}$. Because a source voltage and a gate voltage of the second transistor $Q_2$ remain the same, a gate-source voltage difference cannot reach the threshold voltage $V_{th2}$ of the second transistor; therefore, the second transistor $Q_2$ always remains disconnected.

It may be seen from the foregoing analysis that, when the input voltage is higher than the protection voltage of the overvoltage protection apparatus, the first transistor $Q_1$ is conducted, and the second transistor $Q_2$ is disconnected. The overvoltage protection apparatus according to the embodiment can ensure that the second transistor $Q_2$ is disconnected when the input voltage exceeds the protection voltage $V_{ref}+V_{th1}$ of the overvoltage protection apparatus, which results in that the input voltage $V_{in}$ cannot supply power to the device, thereby achieving an effect of high voltage protection.

Sudden High Voltage Protection Mode

Figure 7:
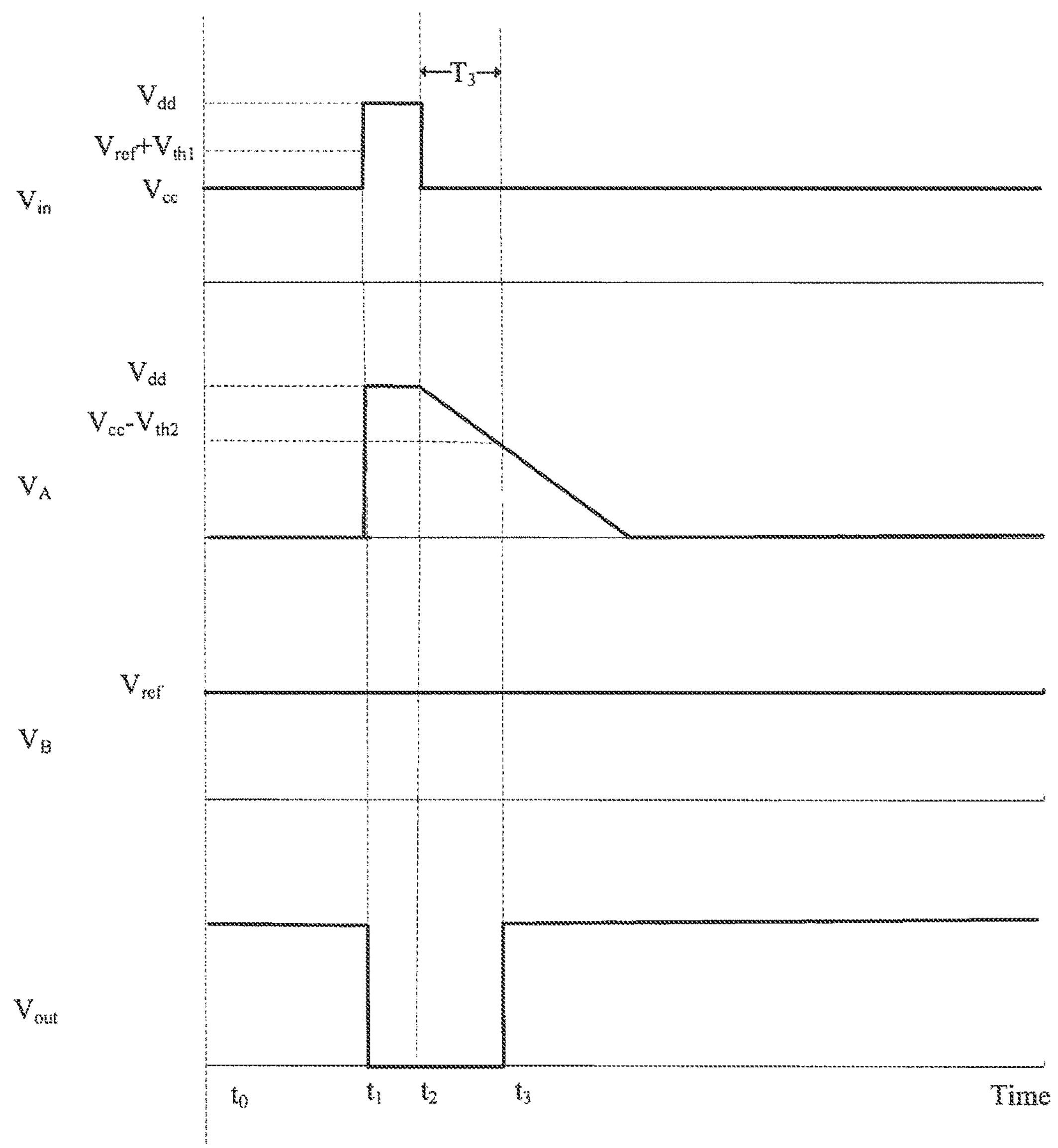
FIG. 7 illustrates an operational timing diagram of the overvoltage protection apparatus according to the embodiment described in FIG. 3 in a sudden high voltage protection mode.

FIG. 7 illustrates a waveform diagram of the overvoltage protection apparatus according to the embodiment described in FIG. 3, where the overvoltage protection apparatus works in a sudden high voltage protection mode. The sudden high voltage protection mode refers to that, in a normal working mode, an input voltage suddenly rises to a high voltage that is higher than the protection voltage.

As shown in FIG. 7, from the time $t_0$ to the time $t_1$, the input voltage $V_{in}$ meets $V_{in}\leq V_{ref}+V_{th1}$, and therefore, the overvoltage protection apparatus works in a normal power supply mode, and the output voltage meets $V_{out}=V_{in}$. At the time $t_1$, the input voltage $V_{in}$ suddenly rises to a voltage higher than $V_{ref}+V_{th1}$, and the overvoltage protection apparatus immediately enters into a high voltage protection mode, that is, the first transistor $Q_1$ is conducted, and the voltage $V_A$ at the point A rises to the $V_{in}$, making the second transistor $Q_2$ become disconnected, and making the output voltage $V_{out}$ become 0. At the time $t_2$, the input voltage $V_{in}$ restores to an allowable range below $V_{ref}+V_{th1}$, and in this case, the first transistor $Q_1$ is disconnected, and as the first resistor $R_1$ discharges, the voltage at the point A gradually drops till the time $t_3$. When the voltage at the point A meets $V_A<V_{in}-V_{th2}$, the second transistor Q2 is conducted, and the overvoltage protection apparatus restores normal power supply.

It may be seen from the foregoing analysis that, the overvoltage protection apparatus according to the embodiment immediately enters into a high voltage protection mode if the input voltage $V_{in}$ rises to a voltage higher than the protection voltage $V_p$ (that is, $V_{ref}+V_{th1}$) in a normal working mode, making the first transistor conducted and the second transistor disconnected, so as to cut off power supply to the device to prevent the device from being damaged;

when the input voltage restores to an allowable range (not exceeding the protection voltage), the first transistor is disconnected, and the second transistor is conducted after the input voltage reaches a stable state and remains in the stable state for a delay time $T_3$, so that the overvoltage protection apparatus restores to the normal working mode. A charging and discharging circuit formed by the capacitor $C_1$ and the first resistor $R_1$ controls a rate of change of the voltage at the point A, that is, determines the delay time $T_3$.

The present invention further provides a device having an overvoltage protection apparatus according to the embodiment of the present invention, where an input end of the overvoltage protection apparatus is configured to connect to an external adapter, and an output end of the overvoltage protection apparatus is configured to connect to an input end of a power source of the device.

Although the foregoing describes exemplary embodiments of the present invention, the present invention is not limited to this. For example, a Zener diode may be replaced by another active or passive voltage regulator circuit or voltage regulator, as long as it can provide a stable reference voltage.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims. However, the implementation manners of the present invention are not limited to this. For example, a Zener diode may be replaced by another active or passive voltage regulator circuit or voltage regulator, as long as it can provide a stable reference voltage.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An overvoltage protection apparatus, comprising:
- an apparatus input;
- an apparatus output;
- a soft-starter coupled to the apparatus input and the apparatus output; and
- a processor coupled to the apparatus input and the soft-starter, the processor being configured to:
  - determine whether an input voltage on the apparatus input exceeds a preset protection voltage; and
  - notify the soft-starter whether the input voltage exceeds the preset protection voltage,
- the soft-starter being configured to:
  - deliver the input voltage to the apparatus output when the input voltage does not exceed the preset protection voltage and when an overvoltage exceeding the preset protection voltage does not exist; and
  - immediately stop delivering the input voltage to the apparatus output when the input voltage exceeds the preset protection voltage or when the overvoltage exceeding the preset protection voltage exists,
- the processor comprising:
  - a first transistor having a first transistor gate, a first transistor source coupled to the apparatus input, and a first transistor drain coupled to the soft-starter;
  - a diode having a positive electrode coupled directly to the first transistor gate and a negative electrode coupled to a ground; and
  - a first resistor located between the first transistor source and the first transistor gate, and
- the soft-starter comprising:
  - a second transistor having a second transistor source coupled to the apparatus input, a second transistor gate coupled to the first transistor drain and the ground, and a second transistor drain coupled to the apparatus output;
  - a second resistor located between the second transistor gate and the negative electrode of the diode; and
  - a capacitor located between the second transistor source and the second transistor gate, the capacitor and the second resistor configured to delay turning on the second transistor after the input voltage is applied to the apparatus input when the input voltage is increasing and does not exceed the preset protection voltage.

2. The overvoltage protection apparatus according to claim 1, wherein the first transistor is disconnected when the input voltage does not exceed the preset protection voltage, and the second transistor is conducted when the input voltage does not exceed the preset protection voltage and after the input voltage remains stable.

3. The overvoltage protection apparatus according to claim 1, wherein the first transistor is conducted when the input voltage exceeds the preset protection voltage, and the second transistor is disconnected when the input voltage exceeds the preset protection voltage.

4. The overvoltage protection apparatus according to claim 1, wherein the preset protection voltage depends on a sum of a voltage of the diode and a threshold voltage of the first transistor.

5. The overvoltage protection apparatus according to claim 2, wherein the preset protection voltage depends on a sum of a voltage of the diode and a threshold voltage of the first transistor.

6. The overvoltage protection apparatus according to claim 3, wherein the preset protection voltage depends on a sum of a voltage of the diode and a threshold voltage of the first transistor.

7. The overvoltage protection apparatus according to claim 1, wherein the first transistor and the second transistor are p-channel metal-oxide-semiconductor (PMOS) transistors, and the apparatus consists essentially of the first transistor, the diode, the first resistor, the second transistor, the second resistor, and the capacitor.

8. The overvoltage protection apparatus according to claim 2, wherein the first transistor and the second transistor are p-channel metal-oxide-semiconductor (PMOS) transistors.

9. The overvoltage protection apparatus according to claim 3, wherein the first transistor and the second transistor are p-channel metal-oxide-semiconductor (PMOS) transistors.

10. The overvoltage protection apparatus according to claim 4, wherein the first transistor and the second transistor are p-channel metal-oxide-semiconductor (PMOS) transistors.

11. The overvoltage protection apparatus according to claim 5, wherein the first transistor and the second transistor are p-channel metal-oxide-semiconductor (PMOS) transistors.

12. The overvoltage protection apparatus according to claim 6, wherein the second transistor is a bipolar transistor.

13. An apparatus, comprising:

an apparatus input;

an apparatus output;

a ground;

a processor coupled to the apparatus input and comprising:

a first transistor having a first transistor gate, a first transistor source coupled to the apparatus input, and a first transistor drain;

a diode having a positive electrode coupled directly to the first transistor gate and a negative electrode coupled to the ground; and a first resistor coupled to the apparatus input and the first transistor gate; and a soft-starter coupled to the apparatus input, the apparatus output, and the processor, and the soft-starter comprising:

a second transistor having a second transistor source coupled to the apparatus input, a second transistor gate coupled to the first transistor drain, and a second transistor drain coupled to the apparatus output;

a second resistor coupled to the second transistor gate and the negative electrode of the diode; and a capacitor coupled to the second transistor source and the second transistor gate, the capacitor and the second resistor configured to delay turning on the second transistor after an input voltage is applied to the apparatus input when the input voltage is increasing and does not exceed a preset protection voltage, and the apparatus being configured to:

deliver the input voltage to the apparatus output when the input voltage does not exceed the preset protection voltage and when an overvoltage exceeding the preset protection voltage does not exist; and immediately stop delivering the input voltage to the apparatus output when the input voltage exceeds the preset protection voltage or when the overvoltage exceeding the preset protection voltage exists.

14. The apparatus of claim 13, wherein the first resistor is located between the apparatus input and the first transistor gate, the second resistor is located between the second transistor gate and the ground, and the capacitor is located between the second transistor source and the second transistor gate.

15. The apparatus of claim 13, wherein the apparatus protects against the input voltage exceeding the preset protection voltage, the preset protection voltage is a sum of a voltage of the diode and a threshold voltage of the first transistor, and the first transistor and the second transistor are p-channel metal-oxide-semiconductor (PMOS) transistors.

16. The apparatus of claim 15, wherein the first transistor is on when the input voltage exceeds the preset protection voltage, the first transistor is off when the input voltage does not exceed the preset protection voltage, the second transistor is on when the input voltage does not exceed the preset protection voltage and after the input voltage remains stable, and the second transistor is off when the input voltage exceeds the preset protection voltage.

17. An apparatus, comprising:

an apparatus input;

an apparatus output;

a ground;

a first transistor having a first transistor gate, a first transistor source coupled to the apparatus input, and a first transistor drain;

a diode having a positive electrode coupled directly to the first transistor gate and a negative electrode coupled to the ground;

a first resistor coupled to the apparatus input and the first transistor gate;

a second transistor having a second transistor source coupled to the apparatus input, a second transistor gate coupled to the first transistor drain, and a second transistor drain coupled to the apparatus output;

a second resistor coupled to the second transistor gate and the negative electrode of the diode; and a capacitor coupled to the second transistor source and the second transistor gate, the capacitor and the second resistor configured to delay turning on the second transistor after an input voltage is applied to the apparatus input when the input voltage is increasing and does not exceed a preset protection voltage, and the apparatus being configured to:

deliver the input voltage to the apparatus output when the input voltage does not exceed the preset protection voltage and when an overvoltage exceeding the preset protection voltage does not exist; and immediately stop delivering the input voltage to the apparatus output when the input voltage exceeds the preset protection voltage or when the overvoltage exceeding the preset protection voltage exists.

18. The apparatus of claim 17, wherein the first resistor is located between the apparatus input and the first transistor gate, the second resistor is located between the second transistor gate and the ground, and the capacitor is located between the second transistor source and the second transistor gate.

19. The apparatus of claim 18, wherein the apparatus protects against the input voltage exceeding the preset protection voltage, the preset protection voltage is a sum of a voltage of the diode and a threshold voltage of the first transistor, and the first transistor and the second transistor are p-channel metal-oxide-semiconductor (PMOS) transistors.

20. The apparatus of claim 19, wherein the first transistor is on when the input voltage exceeds the preset protection voltage, the first transistor is off when the input voltage does not exceed the preset protection voltage, the second transistor is on when the input voltage does not exceed the preset protection voltage and after the input voltage remains stable, and the second transistor is off when the input voltage exceeds the preset protection voltage.

* * * * *